United States Patent [19]

Komoda et al.

[11] Patent Number: 5,729,126
[45] Date of Patent: Mar. 17, 1998

[54] MASTER SLICE LSI WITH INTEGRATED FAULT DETECTION CIRCUITRY

[75] Inventors: Michio Komoda; Yoshio Inoue, both of Itami, Japan

[73] Assignee: Mitsubishi Denki Kabushiki Kaisha, Tokyo, Japan

[21] Appl. No.: 757,109

[22] Filed: Dec. 2, 1996

Related U.S. Application Data

[63] Continuation of Ser. No. 432,924, May 1, 1995, abandoned, which is a continuation-in-part of Ser. No. 907,054, Jul. 1, 1992, abandoned.

[51] Int. Cl.$^6$ .................................................. G01R 31/00
[52] U.S. Cl. .................................................. 324/158.1
[58] Field of Search ............................... 324/73.1, 158.1, 324/765; 371/22.3, 22.4, 15.1, 16.1, 21.2, 10.3; 365/200, 201; 257/40, 48; 437/8

[56] References Cited

U.S. PATENT DOCUMENTS 4,601,034  7/1986  Sridhar ............................. 371/22.4

OTHER PUBLICATIONS

Sridhar et al; "Design of Easily Testable Bit Sliced Systems"; IEEE Transactions on Computers, vol. C-30, No. 11, Nov. 1981, pp. 842-854.

McChiskey et al; "Design For Autonomous Test"; IEEE transactions on Computers, vol. 30, No. 11, Nov. 1981; pp. 866-875.

Tsui; "On Wafer and On Module Chip Testing"; IBM Technical Disclosure Bulletin, vol. 28, No. 8, Jan. 1984; pp. 4312-4323.

Tsui; "In Situ Testability Design (ISTD)—A New Approach for Testing High Speed LSI/VLSI logic"; Proceedings of the IEEE, vol. 70, No. 1, Jan. 1982; pp. 59-78.

Primary Examiner—Vinh P. Nguyen
Attorney, Agent, or Firm—Morrison Law Firm

[57] ABSTRACT

A master slice LSI with fault detection circuitry includes a packed transistor area consisting of rows of semiconductor devices packed on a substrate. Parts of the rows are used for providing an application specific integrated circuit (ASIC). Remaining parts of the rows are used for providing fault detection circuitry for finding faulty semiconductor devices. The fault detection circuitry includes shift registers, sense amplifiers, and a decoder. The detection circuitry is provided only for those rows of semiconductor devices used for providing the intended purpose ASIC.

23 Claims, 7 Drawing Sheets

MASTER SLICE LSI WITH INTEGRATED FAULT DETECTION CIRCUITRY

This application is a continuation of Ser. No. 08/432,924 filed on May 1, 1995 (now abandoned), which is a continuation-in-part of Ser. No. 07/907,054 filed on Jul. 1, 1992, now abandoned.

BACKGROUND OF THE INVENTION

This invention relates to a master slice large scale integrated circuit (LSI), and more particularly, to fault detection circuitry within a master slice LSI.

Master slice LSI's are well known in the semiconductor manufacturing industry. Master slice LSI's are LSI's of a type in which an array of semiconductor devices, such as transistors, are packed in a substrate with part of the array wired to provide an application specific integrated circuit (ASIC) for a specific function. Such ASIC's are ones which may not be suitable for large scale mass production. All of the semiconductor devices used to provide the ASIC must be free of defects.

In an article "High Performance CMOS Array with an Embedded Test Structure", by Kerry Pierce et al. in Proceedings of the IEEE 1990, CUSTOM INTEGRATED CIRCUIT CONFERENCE, held in Boston from Apr. 13–16, 1990, a master slice LSI is shown. The master slice LSI shown in this article includes rows of a number of transistors packed on a substrate, a set of sense amplifiers for checking the respective transistors for faults by means of a test signal and detecting a fault indicating signal, a set of shift registers for detecting the locations of fault transistors for each of the transistor rows, a decoder for sequentially distributing a test signal to respective transistor rows, and a test control circuit. Along the periphery of the substrate, a number of electrodes are disposed.

A test signal is applied to the decoder from a given one of the electrodes, and the decoder applies the test signal sequentially to the transistor rows. The sense amplifiers sense a fault indicating signal, and the shift registers determine the location of a faulty transistor. A signal indicating the location of the faulty transistor is derived from another one of the electrodes. The control circuit may be omitted.

Since wiring can be provided as desired among any of a number of packed transistors to provide desired functions, such a master slice manufacturing technique is suitable for manufacturing a relatively small number (several thousands or several tens of thousands) of a wide variety of types of ASIC's.

In the master slice LSI disclosed in the above-cited article, the sense amplifier set requires sense amplifiers corresponding in number to the packed transistor rows. The shift register set requires shift registers corresponding in number to the number of the transistor rows. Each shift register includes elements equal in number to the transistor rows. The decoder must have the capability of processing signals corresponding to the number of transistor columns. Accordingly, the area occupied by the test circuit including the sense amplifiers, the shift registers, the decoder, and the control circuit is usually more than 20% of the area occupied by the packed transistors.

However, in order to produce a desired ASIC, wiring must be provided to interconnect necessary transistors and transistor rows. This requirement does not permit all of the transistor rows to be used to provide semiconductor devices. Usually, every third row of transistors is used with wiring disposed on the remaining rows. Thus, sense amplifiers and shift registers created for those transistor rows which are not used in the ASIC are wasted.

OBJECTS AND SUMMARY OF THE INVENTION

Accordingly, an object of the present invention is to overcome the drawbacks and limitations of the prior art.

An object of the present invention is to provide a reduced area master slice LSI with fault detecting circuitry.

Another object of the present invention is to improve the yield of master slice LSI's by reducing production of rejectable products.

The reduction of the LSI area is accomplished by providing sense amplifiers and shift registers only for those transistor rows which are actually used in the ASIC. Manufacturing unused sense amplifiers and shift registers is eliminated. Thus, the total surface area required to provide the same number of semiconductor devices is reduced. Reduction of the LSI area results in a reduction of material and labor costs.

The rate of production of rejectable LSI's is considered to be proportional to the area of the LSI's. Accordingly, the reduction of LSI areas results in reduction of production of rejectable LSI's and increases the yield rate.

Briefly stated, a master slice LSI with fault detection circuitry includes a packed transistor area consisting of rows of semiconductor devices packed on a substrate. Parts of the rows are used for providing an application specific integrated circuit (ASIC). Remaining parts of the rows are used for providing fault detection circuitry for finding faulty semiconductor devices. The fault detection circuitry includes shift registers, sense amplifiers, and a decoder. The detection circuitry is provided only for those rows of semiconductor devices used for providing the intended purpose ASIC.

According to an embodiment of the present invention, a master slice LSI with fault detection circuitry includes a packed transistor area consisting of a plurality of rows of semiconductor devices packed on a substrate, a first set of the plurality of rows being reserved for forming circuits, at least one of the plurality of rows including means for distributing a test signal to others of the plurality of rows of semiconductor devices, a second set of the plurality of rows including means for detecting a fault indicating signal indicating a faulty semiconductor device within the first set of the plurality of rows of semiconductor devices, the fault indicating signal being produced in response to the test signal, and a third set of the plurality of rows containing means for determining a location of the faulty semiconductor device within the first set of the plurality of rows of semiconductor devices.

According to an embodiment of the present invention, a master slice LSI with fault detection circuitry includes a packed transistor area consisting of a plurality of rows of semiconductor devices packed on a surface of a substrate, a plurality of active rows within the plurality of rows providing a particular function to be performed by the master slice LSI, a remainder of the plurality of rows, each of the plurality of active rows being separated from another of the plurality of active rows by at least one of the remainder of the plurality of rows, a decoder for distributing a test signal among the active rows, the decoder being on at least one of the remainder of the plurality of rows, a plurality of sense amplifiers formed of the semiconductor devices for detecting the test signal, a first portion of at least one of the plurality of rows including at least one of the plurality of sense amplifiers, a plurality of shift registers formed of the semiconductor devices for detecting a location of a fault, and a second portion of the at least one of the plurality of rows having a first portion including at least one of the plurality of shift registers.

According to an embodiment of the present invention, a master slice LSI with fault detection circuitry includes a packed transistor area consisting of a plurality of rows of semiconductor devices packed on a surface of a substrate, the plurality of rows including a plurality of active rows providing a particular function to be performed by the master slice LSI, a remainder of the plurality of rows being not used to provide the particular function, each of the plurality of active rows being separated by at least one of the remainder, a decoder for distributing a test signal among the active rows, the decoder being on at least one of the remainder of the rows, a set of sense amplifiers for detecting the test signal, the set of sense amplifiers being formed of the semiconductor devices on a portion of one of the plurality of active rows and the remainder, a set of shift registers for detecting a location of a fault, and the set of shift registers being formed of the semiconductor devices on a portion of one of the plurality of active rows and the remainder.

According to an embodiment of the present invention, a master slice LSI device includes an input/output circuit section disposed about an edge of the device and transferring signals between an internal cell area and external points, the internal cell area consisting essentially of a multiplicity of semiconductor devices packed on a substrate, the multiplicity of semiconductor devices arranged in a plurality of rows on the substrate, means for electrically connecting a first group of the multiplicity of semiconductor devices to constitute a desired LSI having an intended function, and fault detection circuitry including means for electrically connecting a second group of the multiplicity of semiconductor devices to constitute the fault detection circuitry.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
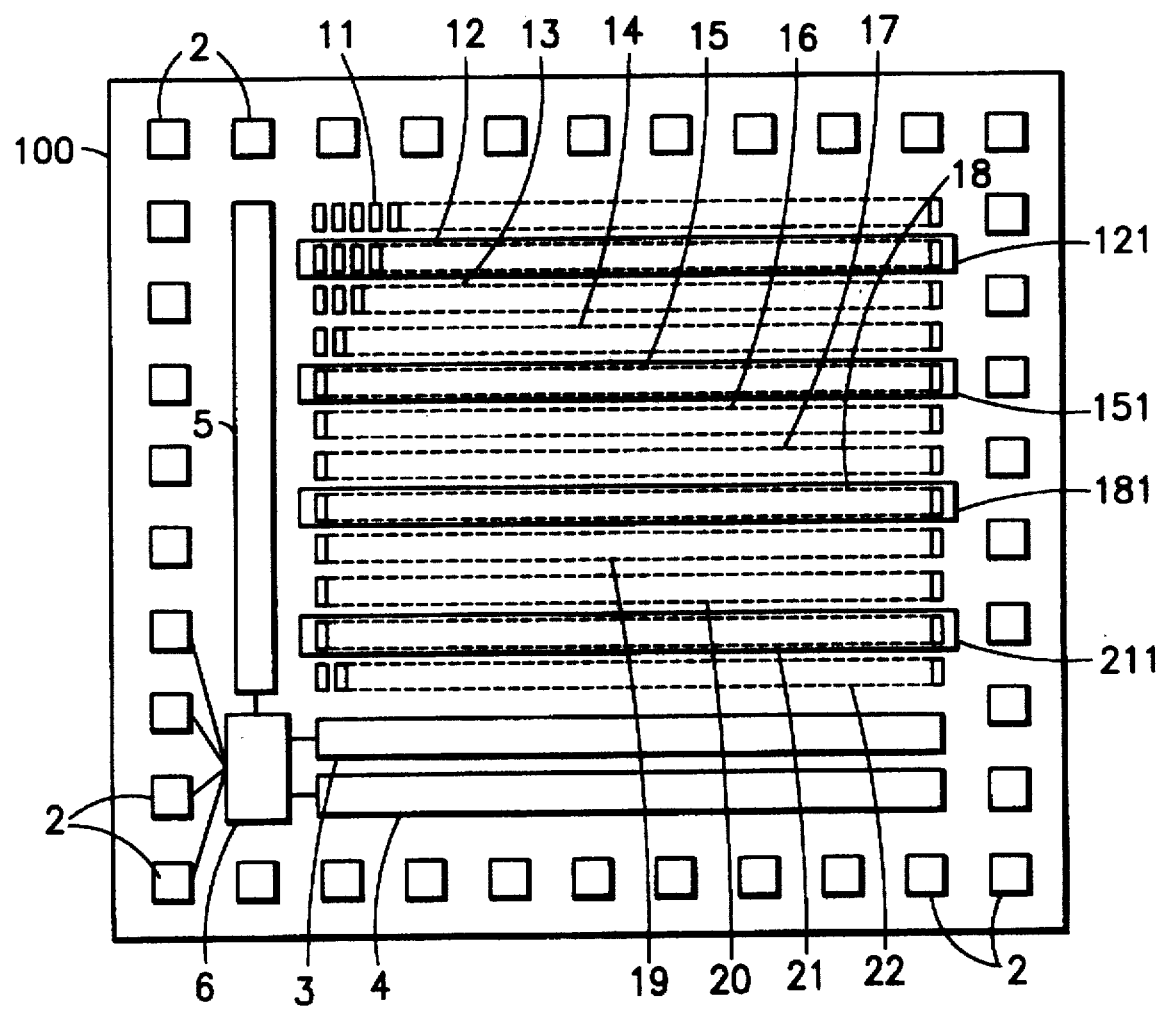
FIG. 1 shows a conventional master slice LSI according to the prior art with fault detection circuitry consisting of a set of sense amplifiers, a shift register, a decoder, and a test control circuit disposed outside a packed transistor area.

Referring to FIG. 1, a conventional LSI substrate 100 includes a plurality of rows of transistors 11, 12, 13, ..., 22 packed in an area surrounded by a plurality of electrodes 2, a sense amplifier set 3, a shift register 4, a decoder 5, and a test control circuit 6. The only transistor rows actually used to provide an intended function ASIC are rows 12, 15, 18, and 21, which are surrounded by sections 121, 151, 181, and 211. The remaining rows 11, 13, 14, 16, 17, 19, 20, and 22 are not used for the ASIC. The space occupied by the unused transistor rows are used for disposing wiring (not shown) for interconnecting the used transistor rows 12, 15, 18, and 21, sense amplifier set 3, shift register 4, and decoder 5.

Figure 2:
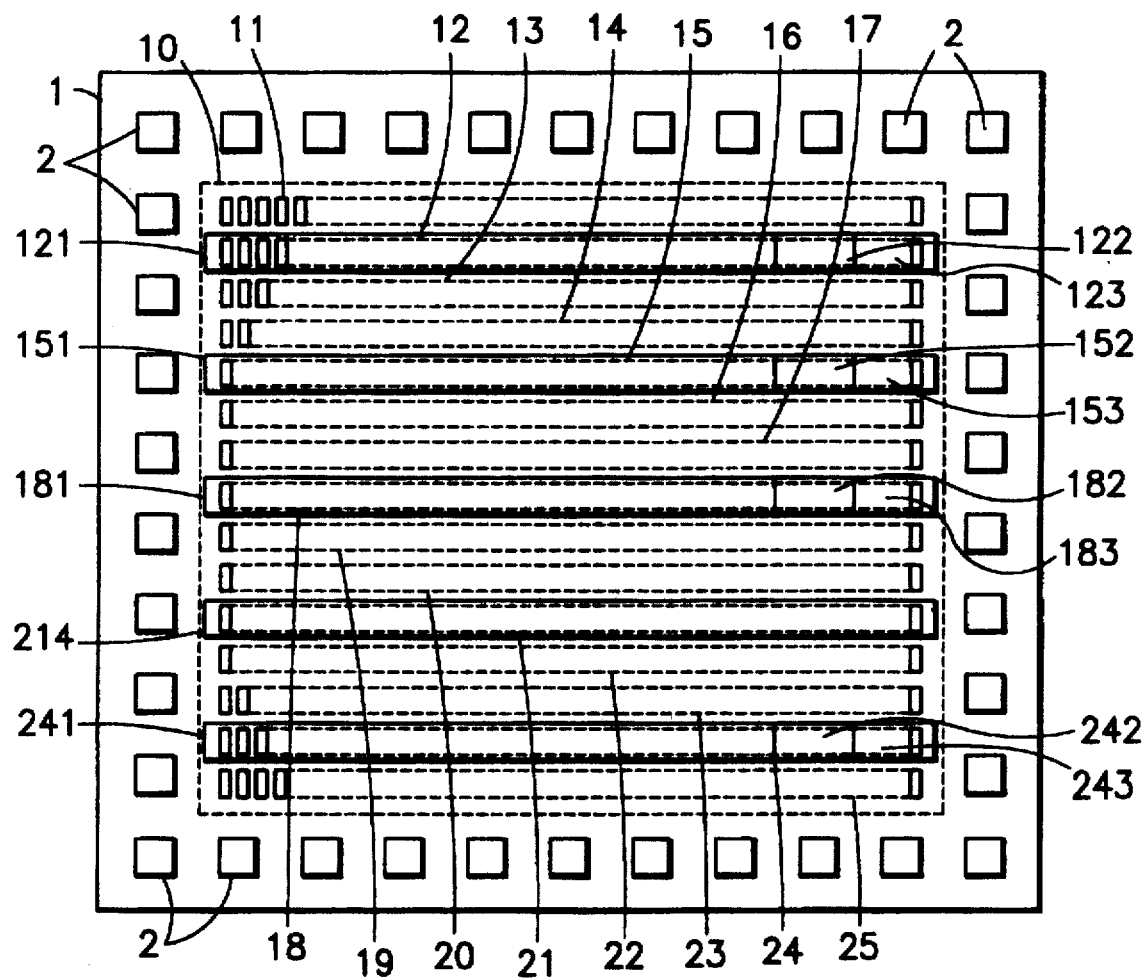
FIG. 2 shows a master slice LSI with fault detection circuitry according to a first embodiment of the present invention in which transistors are packed in rows, a sense amplifier set and a shift register are formed by transistors in each of rows used for an intended purpose ASIC, and a decoder is formed by a transistor row not used for the ASIC.

Referring to FIG. 2, a first embodiment of the present invention is shown. A plurality of electrodes 2 are arranged along a periphery of a substrate 1. A plurality of rows 11, 12, 13, ..., 25 of a multiplicity of semiconductor devices are packed in a packed transistor area 10 surrounded by electrodes 2. Each semiconductor device is depicted in the figures as a small vertically elongated rectangle. If, for example, CMOS transistors are used, paired P-channel and N-channel transistors act as a unit device. Usually, each row includes several thousands of semiconductor devices. Several tens of such rows are disposed on the substrate.

Device rows 12, 15, 18, and 24 are used to provide a desired ASIC having an intended function. Semiconductor devices disposed in sections 121, 151, 181, and 241 of the respective used semiconductor device rows 12, 15, 18, and 24 are used to provide the intended ASIC function. Sense amplifier sets 122, 152, 182, and 242 for the semiconductor devices in the respective sections 121, 151, 181, and 241, and shift registers 123, 153, 183, and 243 for the semiconductor devices in the same respective sections 121, 151, 181, and 241 are formed by the unused semiconductor devices in the same rows as the respective sections which are not used in providing the intended function ASIC. A decoder 214 is formed by semiconductor devices in row 21 which is not used in providing the intended function ASIC. In this embodiment, rows 11, 13, 14, 16, 17, 19, 20, 22, 23, and 25 are unused rows suitable for containing wiring (not shown).

Figure 3A:
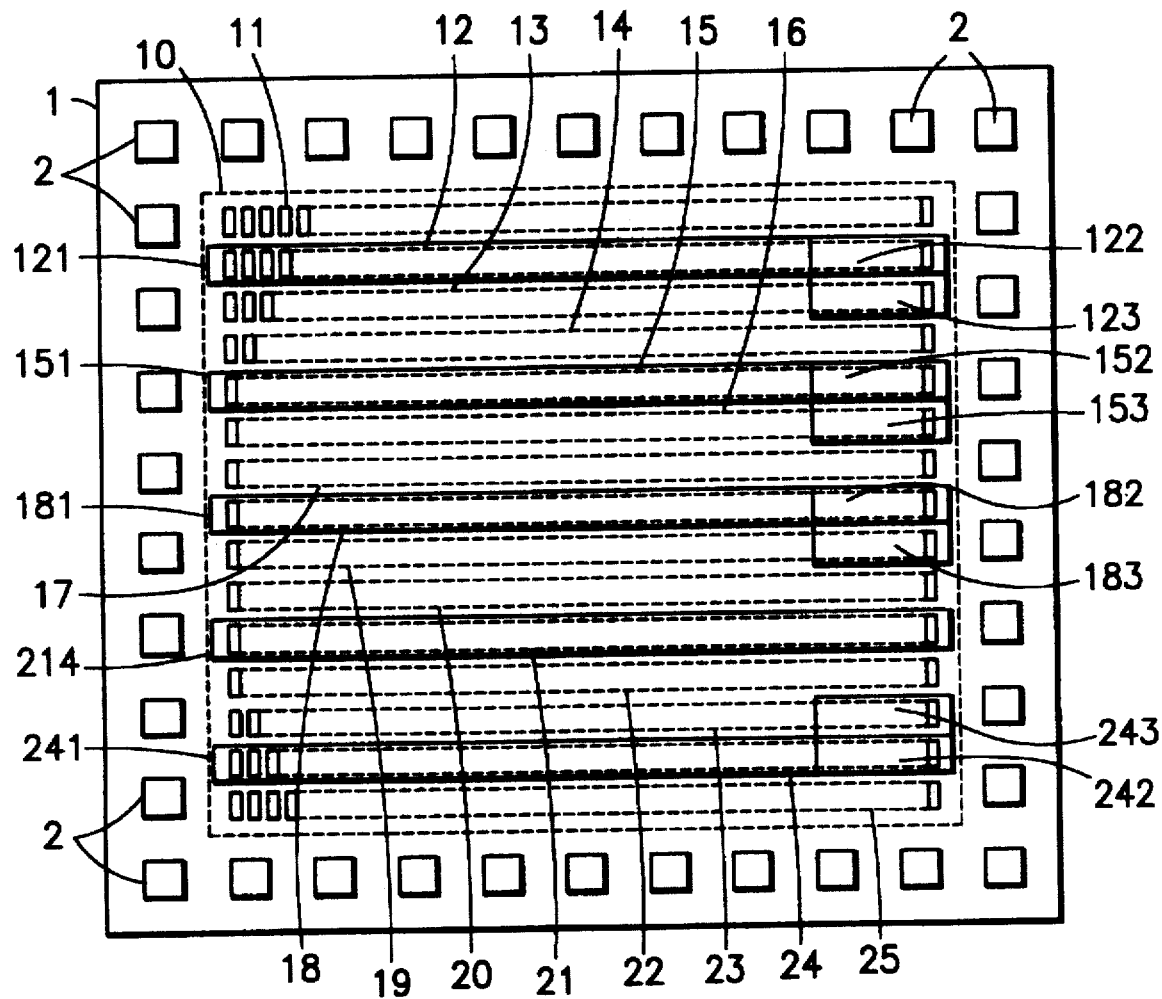
FIG. 3A shows a master slice LSI with fault detection circuitry according to a second embodiment of the present invention in which a sense amplifier set is formed for each transistor row used for an intended purpose ASIC by transistors in that transistor row, a shift register for that transistor row is formed in an adjacent unused row, and a decoder is formed in another unused transistor row.

Referring to FIG. 3A, a second embodiment of the present invention is shown. A plurality of rows 12, 15, 18, and 24 of a multiplicity of semiconductor devices include respective sections 121, 151, 181, and 241 containing semiconductor devices used for the intended purpose of providing a desired ASIC function. Respective sense amplifier sets 122, 152, 182, and 242 for the semiconductor devices in the respective associated sections are included in the same respective row. Shift registers 123, 153, 183, and 243 for the respective sections 121, 151, 181, and 241 are formed by the semiconductor devices in rows 13, 16, 19, and 23, respectively, which are not used in forming the desired ASIC function. A decoder 214 is formed by semiconductor devices in row 21 which is not used in providing the intended function ASIC. In this embodiment, rows 11, 14, 17, 20, 22, and 25 are unused rows suitable for containing wiring (not shown). Portions of rows 13, 16, 19, and 23 not used to form shift registers 123, 153, 183, and 243 are also suitable for containing wiring (not shown).

Figure 3B:
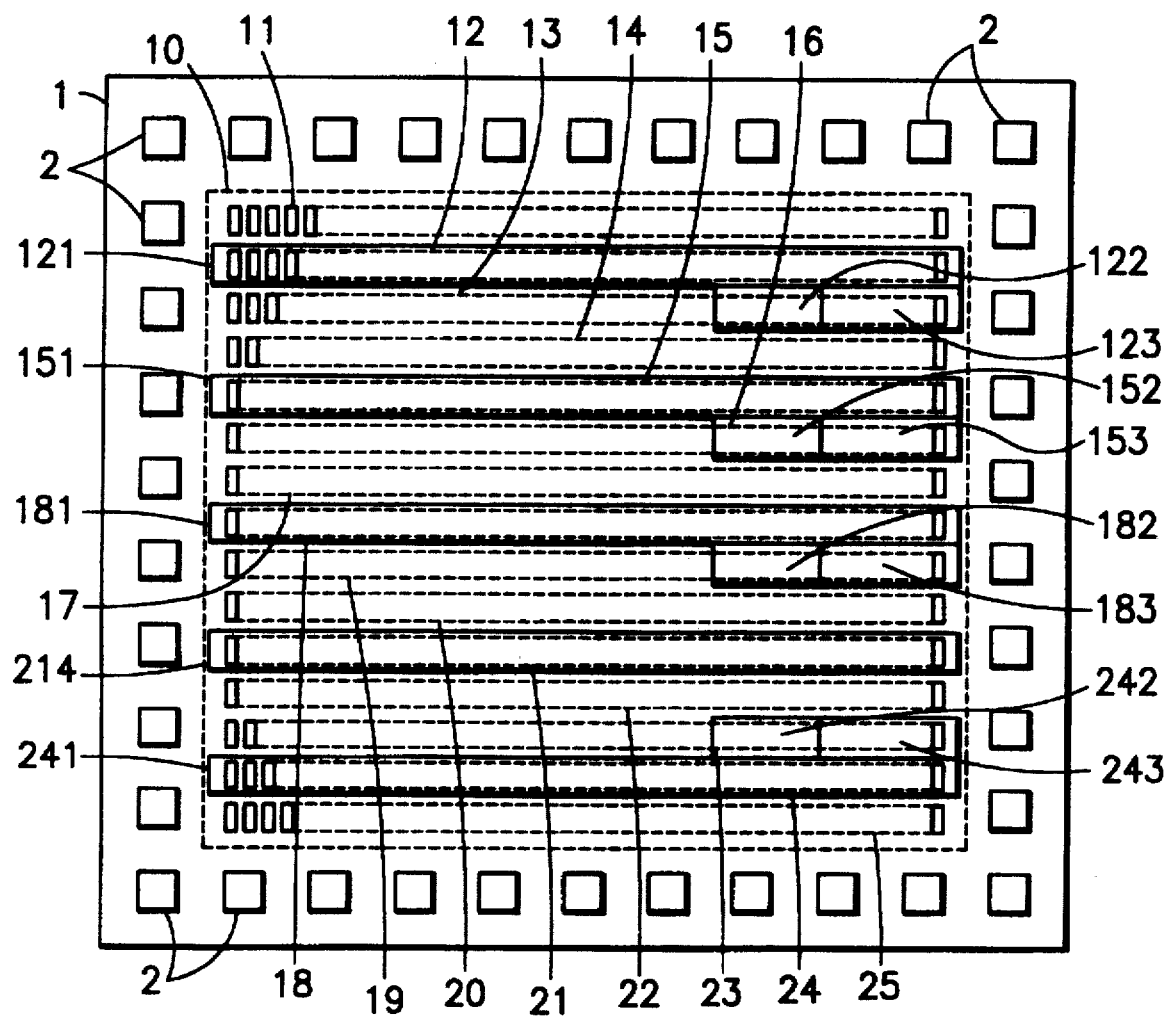
FIG. 3B shows a master slice LSI with fault detection circuitry according to a third embodiment of the present invention in which a sense amplifier set and a shift register set are formed in the same unused transistor row and a decoder is formed in another unused transistor row.

Referring to FIG. 3B, alternatively in a third embodiment of the present invention, respective sense amplifier sets 122, 152, 182, and 242 for the semiconductor devices in the respective associated sections are formed by the semiconductor devices in rows 13, 16, 19, and 23, respectively, which are not used in forming the desired ASIC function. Shift registers 123, 153, 183, and 243 for the respective sections 121, 151, 181, and 241 are included in the same respective row.

Figure 3C:
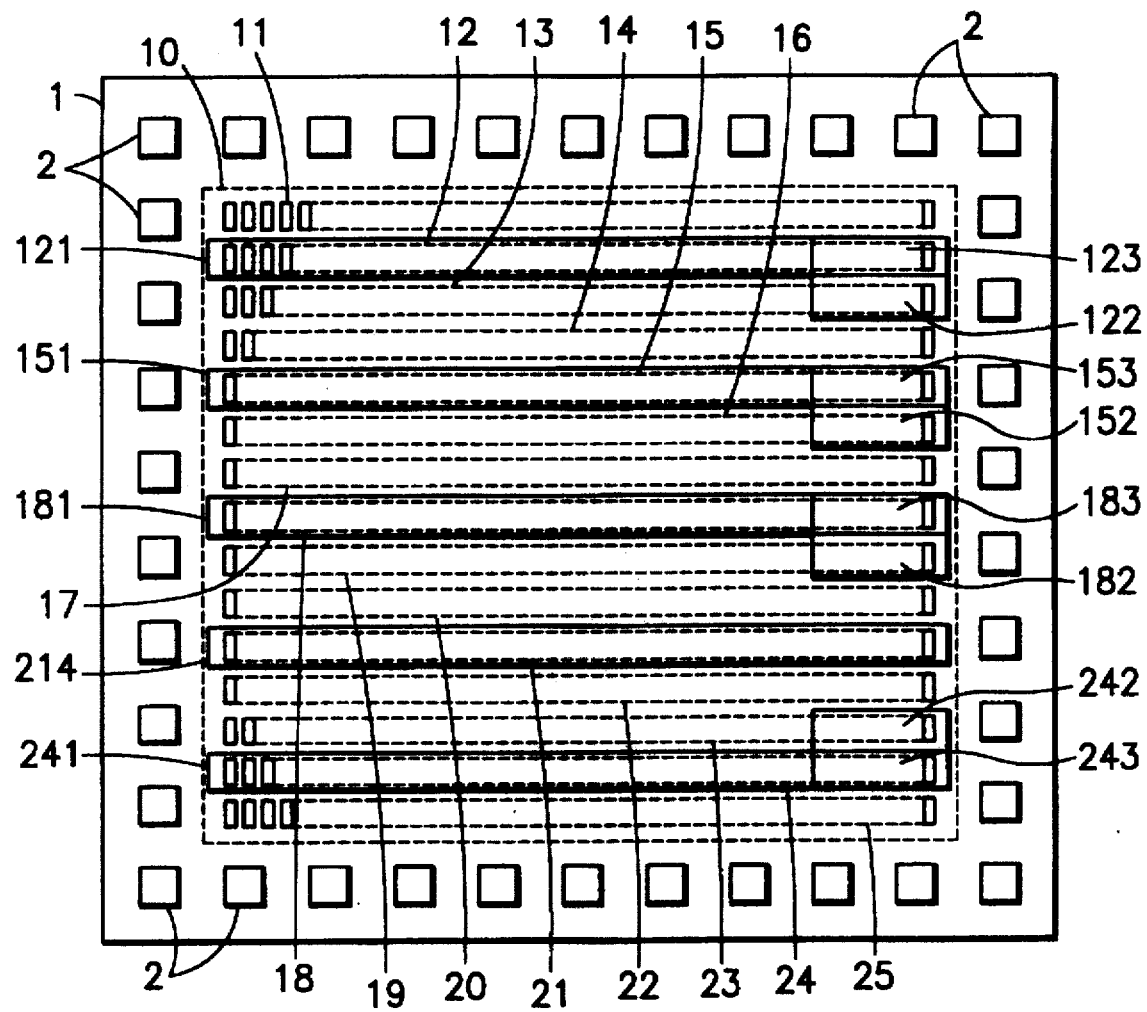
FIG. 3C shows a master slice LSI with fault detection circuitry according to a fourth embodiment of the present invention in which a shift register set is formed for each transistor row used for an intended purpose ASIC by transistors in that transistor row, a sense amplifier for that transistor row is formed in an adjacent unused row, and a decoder is formed in another unused transistor row.

Referring to FIG. 3C, alternatively in a fourth embodiment of the present invention, respective shift registers 123, 153, 183, and 243 for the respective sections 121, 151, 181, and 241 are formed by the semiconductor devices in rows 12, 15, 18, and 24 which are used in forming the desired ASIC function. Sense amplifier sets 122, 152, 182, and 242 for the semiconductor devices in the respective associated sections are formed by the semiconductor devices in rows 13, 16, 19, and 23, respectively, which are not used in forming the desired ASIC function.

Figure 4:
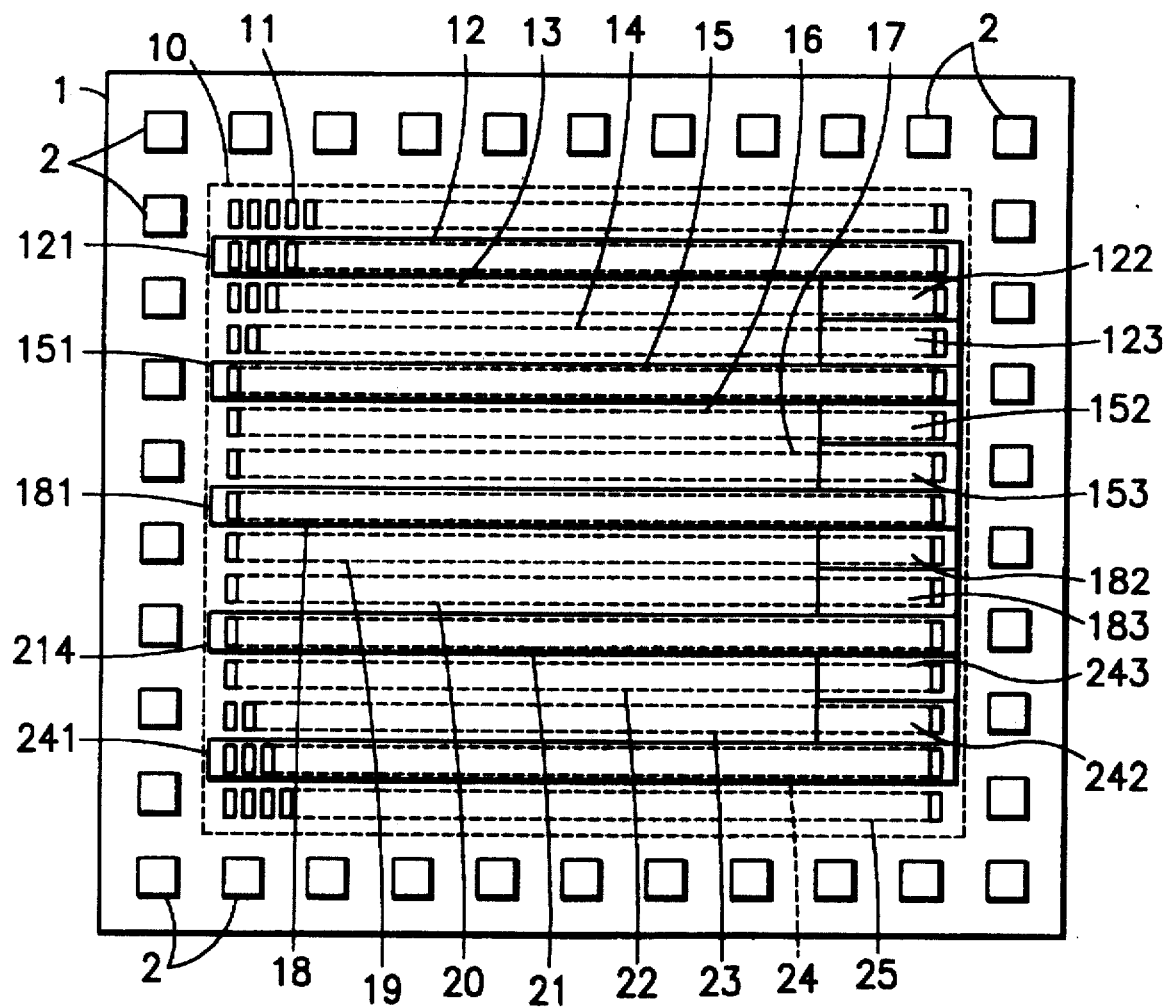
FIG. 4 shows a master slice LSI with fault detection circuitry according to a fifth embodiment of the present invention in which sense amplifier sets, shift registers, and a decoder are formed in transistor rows not used for an intended purpose ASIC.

Referring to FIG. 4, a fifth embodiment of the present invention is shown. Rows of semiconductor devices 12, 15, 18, and 24 include only sections 121, 151, 181, and 241, respectively, containing semiconductor devices which are used to provide a desired ASIC function. Sense amplifier sets 122, 152, 182, and 242 for respective sections 121, 151, 181, and 241 are formed by semiconductor devices in rows 13, 16, 19, and 23, respectively, which are not used in providing the desired ASIC function. Shift registers 123, 153, 183, and 243 for the respective sections 121, 151, 181, and 241 are formed by semiconductor devices in rows 14, 17, 20, and 22, respectively, which are not used in providing the desired ASIC function. Portions of rows 13, 16, 19, and 23 not used for sense amplifier sets 122, 152, 182, and 242 are suitable for containing wiring (not shown). Likewise, portions of rows 14, 17, 20, and 22 not used for shift registers 123, 153, 183, and 243 are suitable for containing wiring (not shown).

Figure 5:
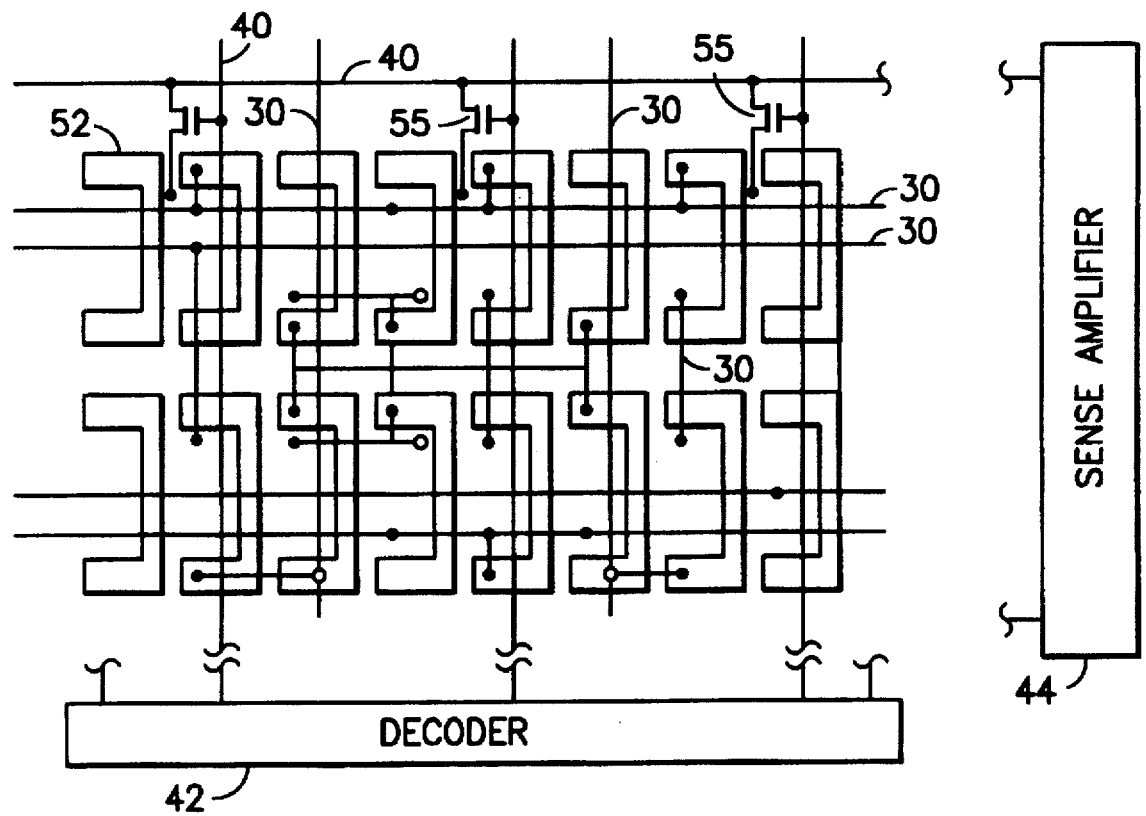
FIG. 5 shows an example of wiring in a master slice LSI that creates fault detection circuitry and an intended purpose ASIC.

Referring to FIG. 5, a part of a master slice LSI according to the present invention is shown. Wiring 30 connects appropriate ones of a plurality of transistors 52 to form an ASIC having an intended function, a flip-flop in this example. A flip flop is one of various components which are frequently used in various ASIC's. Wiring 40 connects a plurality of fault detection transistors 55 to form fault detection circuitry.

The gate of each fault detection transistor 55 is connected to a decoder 42, while the drain is connected to a sense amplifier 44. When decoder 42 causes one of the fault detection transistors 55 to become conductive, sense amplifier 44 monitors a potential at the drain and source of one of the plurality of transistors 52. The potential is stored in a shift register (not shown) and outputted for monitoring.

Part of wiring 30 passes over the unused semiconductor device rows 11, 13, 14, 16, 17, 19, 20, 23, and 25. Different wiring patterns may be used to form different ASIC function circuits. Decoder 42, sense amplifier 44, and the shift registers (not shown) are formed by wiring elements in a similar manner. Providing wiring patterns is known to people skilled in the art.

As described above in detail, an improved master slice LSI according to the present invention including a number of semiconductor devices in rows packed in a substrate is provided. Test circuits including sense amplifier sets, shift registers, and a decoder are disposed only for those semiconductor device rows which are used to provide a desired ASIC function. The test circuits are formed by using part of the semiconductor device rows. Accordingly, there is no need to spare an area for the test circuits. Therefore, the size of the master slice LSI is reduced, which results in reduction of the manufacturing cost.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A master slice LSI with fault detection circuitry, comprising:

a packed transistor area consisting of a plurality of rows of semiconductor devices packed on a substrate, wherein said plurality of rows include a first set of rows, a second set of rows, and a third set of rows;

said first set of said plurality of rows being reserved for forming circuits;

at least one of said plurality of rows including means for distributing a test signal only to each of said first set of rows being reserved for forming circuits;

said second set of said plurality of rows including means for detecting a fault indicating signal indicating a faulty semiconductor device within said first set of said plurality of rows of semiconductor devices, said fault indicating signal being produced in response to said test signal; and said third set of said plurality of rows containing means for determining a location of said faulty semiconductor device within said first set of said plurality of rows of semiconductor devices.

2. A master slice LSI with fault detection circuitry according to claim 1, wherein said first set and said second set share at least one common row.

3. A master slice LSI with fault detection circuitry according to claim 1, wherein said first set and said third set share at least one common row.

4. A master slice LSI with fault detection circuitry according to claim 1, wherein said first set and said second set do not share a common row.

5. A master slice LSI with fault detection circuitry according to claim 1, wherein said first set and said third set do not share a common row.

6. A master slice LSI with fault detection circuitry according to claim 1, wherein said means for distributing a test signal is not within said first set, said second set, or said third set.

7. A master slice LSI with fault detection circuitry, comprising:

a packed transistor area consisting of a plurality of rows of semiconductor devices packed on a surface of a substrate;

at least two active rows within said plurality of rows providing a particular function to be performed by said master slice LSI;

a remainder of said plurality of rows;

each of said at least two active rows being separated from another of said at least two active rows by at least one of said remainder of said plurality of rows;

a decoder for distributing a test signal among said at least two active rows;

said decoder being on at least one of said remainder of said plurality of rows;

a plurality of sense amplifiers formed of said semiconductor devices for detecting said test signal;

a first portion of at least one of said plurality of rows including at least one of said plurality of sense amplifiers;

a plurality of shift registers formed of said semiconductor devices for detecting a location of a fault; and a second portion of said at least one of said plurality of rows having a first portion including at least one of said plurality of shift registers.

8. Apparatus according to claim 7, wherein said first portions are entirely within said at least two active rows and said second portions are entirely within said at least two active rows.

9. Apparatus according to claim 7, wherein said first portions are entirely within said at least two active rows, and said second portions are entirely within said remainder of said plurality of rows.

10. Apparatus according to claim 7, wherein said first portions are entirely within said remainder of said plurality of rows, and said second portions are entirely within said at least two active rows.

11. Apparatus according to claim 7, wherein said first portions and said second portions are entirely within said remainder of said plurality of rows.

12. Apparatus according to claim 11, wherein said first portions are in different ones of said remainder of said plurality of rows from said second portions.

13. A master slice LSI with fault detection circuitry, comprising:

a packed transistor area consisting of a plurality of rows of semiconductor devices packed on a surface of a substrate;

said plurality of rows including a plurality of active rows providing a particular function to be performed by said master slice LSI;

a remainder of said plurality of rows being not used to provide said particular function;

each of said plurality of active rows being separated by at least one of said remainder;

a decoder for distributing a test signal among said active rows;

said decoder being on at least one of said remainder of said rows;

a set of sense amplifiers for detecting said test signal;

said set of sense amplifiers being formed of said semiconductor devices on a portion of one of said plurality of active rows and said remainder;

a set of shift registers for detecting a location of a fault; and said set of shift registers being formed of said semiconductor devices on a portion of one of said plurality of active rows and said remainder.

14. Apparatus according to claim 13, wherein all of said plurality of sense amplifiers are in said active rows.

15. Apparatus according to claim 13, wherein all of said plurality of shift registers are in said active rows.

16. Apparatus according to claim 13, wherein one of said plurality of shift registers and said plurality of sense amplifiers are entirely inside said active rows, and an other one of said plurality of shift registers and said plurality of sense amplifiers is entirely inside said remainder.

17. Apparatus according to claim 13, wherein said plurality of shift registers and said plurality of sense amplifiers are entirely inside said remainder.

18. An apparatus according to claim 13, wherein said plurality of shift registers and said plurality of sense amplifiers are entirely inside said active rows.

19. A master slice LSI device, comprising:

an input/output circuit section disposed about an edge of said device and transferring signals between an internal cell area and external points;

said internal cell area consisting essentially of a multiplicity of semiconductor devices packed on a substrate;

said multiplicity of semiconductor devices arranged in a plurality of rows on said substrate;

means for electrically connecting a first group of said multiplicity of semiconductor devices to constitute a desired LSI having an intended function; and fault detection circuitry including means for electrically connecting a second group of said multiplicity of semiconductor devices to constitute said fault detection circuitry, wherein said fault detection circuitry only interrogates said first group of said multiplicity of semiconductor devices.

20. A master slice LSI device according to claim 19, wherein said fault detection circuitry comprises:

a decoder for distributing a test signal to only each of said rows of said first group of said multiplicity of semiconductor devices on said substrate;

a plurality of sense amplifiers for detecting a signal indicating a fault within a one of said multiplicity of semiconductor devices of said first group of said multiplicity of semiconductor devices;

said fault indicating signal being produced by a faulty one of said multiplicity of semiconductor devices in response to said test signal; and a plurality of shift registers for determining a location of said faulty one of said multiplicity of semiconductor devices in response to an output from said plurality of sense amplifiers.

21. A master slice LSI device according to claim 20, wherein each row of said multiplicity of semiconductor devices containing any one of said first group further includes a group of said plurality of sense amplifiers for detecting said fault indicating signal within said row and further includes one of said plurality of shift registers for determining said location of said faulty one of said multiplicity of semiconductor devices.

22. A master slice LSI device according to claim 20, wherein:

each row of said multiplicity of semiconductor devices containing any one of said first group includes a group of said plurality of sense amplifiers for detecting said fault indicating signal within said row but does not include any of said plurality of shift registers nor said decoder.

23. A master slice LSI device according to claim 20, wherein each row of said multiplicity of semiconductor devices containing any of said first group does not contain any of said second group.

* * * * *